(12) United States Patent
Huang et al.

(10) Patent No.: US 7,256,498 B2
(45) Date of Patent: Aug. 14, 2007

(54) RESISTANCE-REDUCED SEMICONDUCTOR DEVICE AND METHODS FOR FABRICATING THE SAME

(75) Inventors: Yi-Chun Huang, Taoyuan (TW); Jyu-Horng Shieh, Hsin-Chu (TW); Ju-Wang Hsu, Taipei (TW)

(73) Assignee: Taiwan Semiconductor Manufacturing Co., Ltd., Hsin-Chin (TW)

( * ) Notice: Subject to any disclaimer, the term of this patent is extended or adjusted under 35 U.S.C. 154(b) by 0 days.

(21) Appl. No.: 11/190,913

(22) Filed: Jul. 28, 2005

(65) Prior Publication Data

US 2005/0258499 A1 Nov. 24, 2005

Related U.S. Application Data

(63) Continuation-in-part of application No. 10/806,217, filed on Mar. 23, 2004, now abandoned.

(51) Int. Cl.
*H01L 27/04* (2006.01)
(52) U.S. Cl. .................... 257/758; 257/768; 257/532; 257/384; 257/E27.016; 257/E27.033
(58) Field of Classification Search .................. None
See application file for complete search history.

(56) References Cited

U.S. PATENT DOCUMENTS 6,218,733 B1 * 4/2001 Fiordalice et al. .......... 257/751
6,369,429 B1   4/2002 Pramanick et al.
6,633,082 B1 * 10/2003 Oda et al. ................... 257/750
6,727,515 B2 * 4/2004 Nakata et al. ................ 257/40
6,737,744 B2 * 5/2004 Fukuyama ................... 257/750
7,009,279 B2 * 3/2006 Nasu et al. .................. 257/616
7,161,248 B2 * 1/2007 Karasawa et al. ........... 257/758

FOREIGN PATENT DOCUMENTS

JP        59-208450        11/1984

* cited by examiner

*Primary Examiner*—Evan Pert
*Assistant Examiner*—Victor A. Mandala, Jr.
(74) *Attorney, Agent, or Firm*—Birch, Stewart, Kolasch & Birch, LLP

(57) ABSTRACT

Semiconductor devices and methods for fabricating the same. The semiconductor device includes a resistance-reduced transistor with metallized bilayer overlying source/drain regions and gate electrode thereof. A first dielectric layer with a conductive contact overlies the resistance-reduced transistor. A second dielectric layer having a first conductive feature overlies the first dielectric layer. A third dielectric layer with a second conductive feature overlies the second dielectric layer, forming a conductive pathway down to the top surface of the metallized bilayer over one of the source/drain regions or the gate electrode layer.

8 Claims, 9 Drawing Sheets

RESISTANCE-REDUCED SEMICONDUCTOR DEVICE AND METHODS FOR FABRICATING THE SAME

This application is a Continuation-In-Part of application Ser. No. 10/806,217 filed on Mar. 23, 2004, now abandoned the entire contents of which are hereby incorporated by reference and for which priority is claimed under 35 U.S.C. § 120.

BACKGROUND

The present invention relates to semiconductor fabrication technology and in particular to a resistance-reduced semiconductor device fabricated by a self-aligned metallized (SAM) process.

Along with high integration, high performance, and low power consumption in semiconductor devices, a low resistance gate material is required to reduce gate length in transistors and memory cells through formation of fine patterns and to improve device characteristics. The thickness of a gate insulating layer gradually decreases to increase a channel current in a transistor and a memory cell due to low power consumption. In order to prevent short channel effects caused by the reduction of the gate length in a transistor and secure a margin against punchthrough, the sacrificial resistance, for example, sheet resistance and contact resistance of a source/drain region, must be reduced when forming a shallow source/drain.

Therefore, integrated circuits (ICs) fabrication have been fabricated by a salicide (self-aligned silicide) process in which a silicide is formed on the surfaces of a gate and a source/drain region to thereby reduce the resistivity of the gate and the sheet resistance and contact resistance of the source/drain region. The salicide process indicates selective formation of a silicide region only on a gate and a source/drain region. The silicide region is formed of titanium silicide ($TiSi_2$) or materials of the group-VIII silicides (e.g., $PtSi_2$, $PdSi_2$, $CoSi_2$, and $NiSi_2$).

Nevertheless, process issues such as agglomeration or bubbles formed along a polysilicon or silicon boundary of a device do exist in the metal silicide layer having lowered sheet resistance formed by the conventional salicide process through reacting refractory metal with the silicon, and dislocation and discontinuity of boundary structures can be found therein due to poor thermal stability under high annealing temperature. Thus, an issue such as electrical disconnection or increased sheet resistance caused by the agglomeration of the metal silicide occurs and degrades reliability of the semiconductor device.

Hence, there is a need for a better resistance-reduced structure to prevent possible degradation of the metal silicide layer thereof.

SUMMARY

Resistance-reduced semiconductor devices and method for fabricating the same are provided. An exemplary embodiment of a resistance-reduced semiconductor device comprises a resistance-reduced transistor. The resistance-reduced transistor comprises a gate stack on a silicon substrate. A pair of source/drain regions are oppositely formed in the silicon substrate adjacent to the gate stack. A metallized bilayer overlies each source/drain region to thereby reduce resistance thereof, wherein the metallized bilayer comprises a metal top layer. A first dielectric layer with a conductive contact overlies the resistance-reduced transistor. A second dielectric layer having a first conductive feature overlies the first dielectric layer. The first conductive feature and the conductive contact electrically form a conductive pathway down to the top metal layer over one of the source/drain regions.

An exemplary embodiment of a method for fabricating a resistance-reduced semiconductor device comprises providing a silicon substrate having a gate stack formed thereon and a pair of source/drain regions oppositely formed in each side of the substrate adjacent to the gate stack, wherein the gate stack comprises an exposed silicon gate electrode. A metal silicide layer is selectively formed over the source/drain regions and the exposed silicon gate electrode. A metal layer is selectively formed over each metal silicide layer to respectively reduce resistance of each source/drain region and the exposed silicon gate electrode. A first dielectric layer having an electrically conductive contact therein is formed to overlie the gate stack and the source/drain regions. A second dielectric layer having a first electrically conductive feature is formed to overlie the first dielectric layer. A third dielectric layer having a second electrically conductive feature is formed to overlie the second dielectric layer. In some embodiments, the second electrically conductive feature, the first electrically conductive feature and the electrically conductive contact are electrically connected to form a conductive pathway down to the top metal layer over one of the source/drain regions or the silicon gate electrode of the gate stack.

Another embodiment of a method for fabricating a resistance-reduced semiconductor device comprises providing a silicon-containing substrate having a gate stack formed thereon and a pair of source/drain regions oppositely formed in each side of the silicon-containing substrate adjacent to the gate stack, wherein the gate stack comprises an exposed silicon gate electrode. A metallized bilayer is formed over the source/drain regions and the exposed silicon gate electrode to respectively reduce resistance of each source/drain region and the exposed silicon gate electrode, wherein the metallize bilayer comprises a metal top layer. A first dielectric layer having a conductive contact therein is formed to overlie the gate stack and the source/drain regions, wherein the conductive contact electrically contact one of the source/drain regions or the silicon gate electrode of the gate stack. A second dielectric layer having a first conductive feature is formed to overlie the first dielectric layer, wherein the first conductive feature and the conductive contact are electrically connected to form a conductive pathway down to the top metal layer over one of the source/drain regions or the silicon gate electrode of the gate stack.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will became apparent to those skilled in the arc from this detailed description.

BRIEF DESCRIPTION OF THE DRAWINGS

The present invention will become more fully understood from the subsequent detailed description and the accompanying drawings, which are given by way of illustration only, and thus are not limitative of the present invention, and wherein.

DESCRIPTION

In this specification, expressions such as "overlying the substrate", "above the layer", or "on the film" simply denote a relative positional relationship with respect to the surface of the base layer, regardless of the existence of intermediate layers. Accordingly, these expressions may indicate not only the direct contact of layers, but also, a non-contact state of one or more laminated layers. By use of the term "low dielectric constant" or "low-k" herein, is meant a dielectric constant (k value) which is less than the dielectric constant of a conventional silicon oxide. Preferably, the low-k dielectric constant is less than about 3.9.

FIGS. 1 to 8 are cross sections showing a process for fabricating a resistance-reduced semiconductor device in accordance with an embodiment of the invention.

Figure 1:
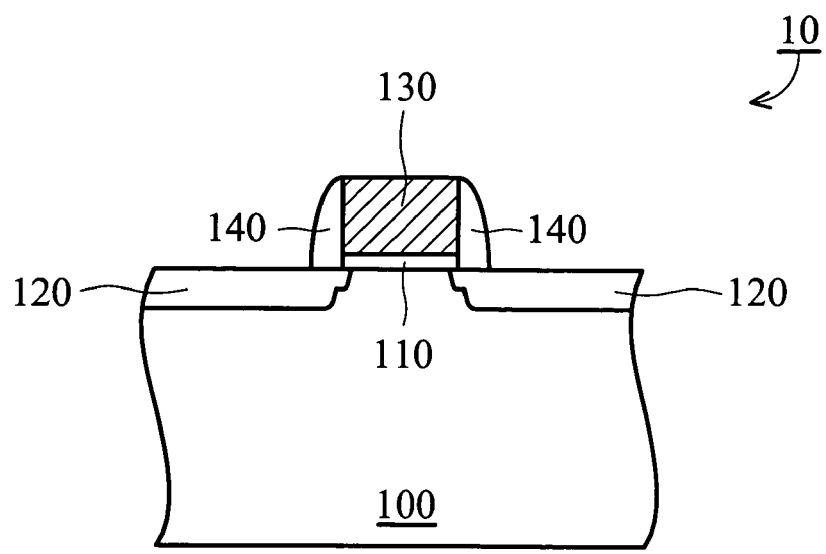
FIGS. 1 to 8 are cross sections of a self-aligned metallized (SAM) process for fabricating a semiconductor device according to an embodiment of the invention.

In FIG. 1, a silicon-containing substrate 100 having a transistor 10 formed thereon is provided. Gate insulating layer 110 and gate electrode 130 of the transistor 10 are sequentially formed over a portion of the silicon substrate 100 to form a gate stack and the gate electrode 130 is insulated from the silicon-containing substrate 100 by the gate insulating layer 110. In addition, a pair of source/drain regions 120 are oppositely disposed in the silicon-containing substrate 100 adjacent to the gate electrode 130. Preferably, the gate electrode 130 is made of polysilicon and can be doped with impurities of proper conductive type, and the source/drain regions 120 are doped regions of N type or P type doping. Further, spacers 140 of insulating material are respectively formed on opposite sidewalls of the gate stack.

Next, the silicon-containing substrate 100 can be pre-cleaned by a cleaning solution such as diluted hydrofluoric (DHF) acid to remove the native oxide (not shown) formed thereon prior to the subsequent process steps.

Figure 2:
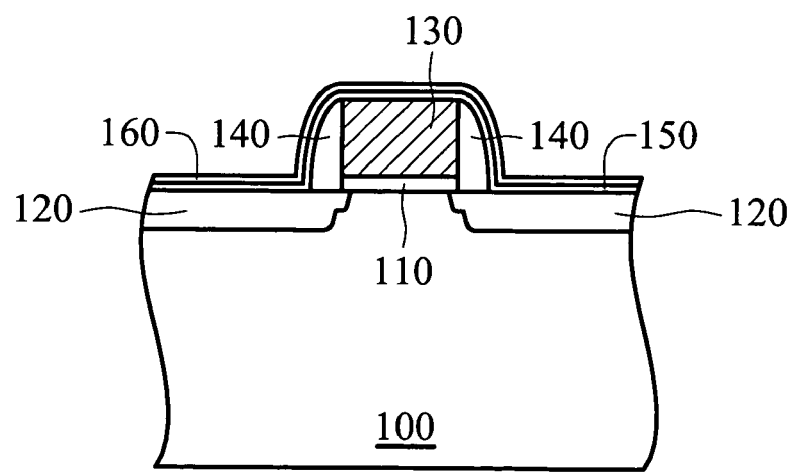

In FIG. 2, a metal layer 150 of about 30 Å to 400 Å is then blanketly formed over the silicon-containing substrate 100 and covers the gate electrode 130, the spacers 140 and the source/drain regions 120. The method for forming the metal layer 150 can be physical vapor deposition (PVD), such as sputtering and material thereof can be Au or refractory metal such as cobalt (Co), tantalum (Ta), titanium (Ti), platinum (Pt), tungsten (W), nickel (Ni), palladium (Pd), etc.

A barrier 160 is then formed over the metal layer 150 to function as a diffusing barrier between the metal layer and the silicon substrate 100. The method for forming the barrier layer 160 can be, for example, chemical vapor deposition (CVD) and the material thereof can be titanium nitride, titanium or a composite layer thereof.

Figure 3:
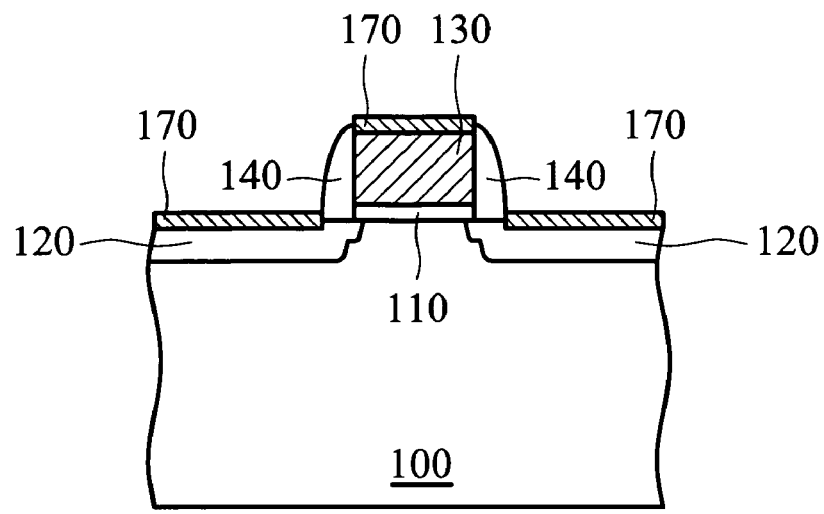

In FIG. 3, a thermal annealing process (not shown) is then performed at 250 to 750° C. to react the metal layer 150 with the silicon atoms in the silicon-containing substrate 100 and the gate electrode 130, thus forming a silicide layer of the metal layer 150. Next, the portion of the metal layer 150 not reacted with the silicon substrate 100 and the gate electrode 130, and the barrier layer are removed through an etching method such as a wet etching. Thus, a metal silicide layer 170 with a first resistivity is formed over the gate electrode 130 and the source/drain regions 120 to respectively reduce the sheet resistance thereof. The metal silicide layer 170, however, has poor resistance to the subsequent etching such as plasma etching and undesirable effects such as agglomeration may occur thereon, thus degrading performance of transistor 10.

Figure 4:
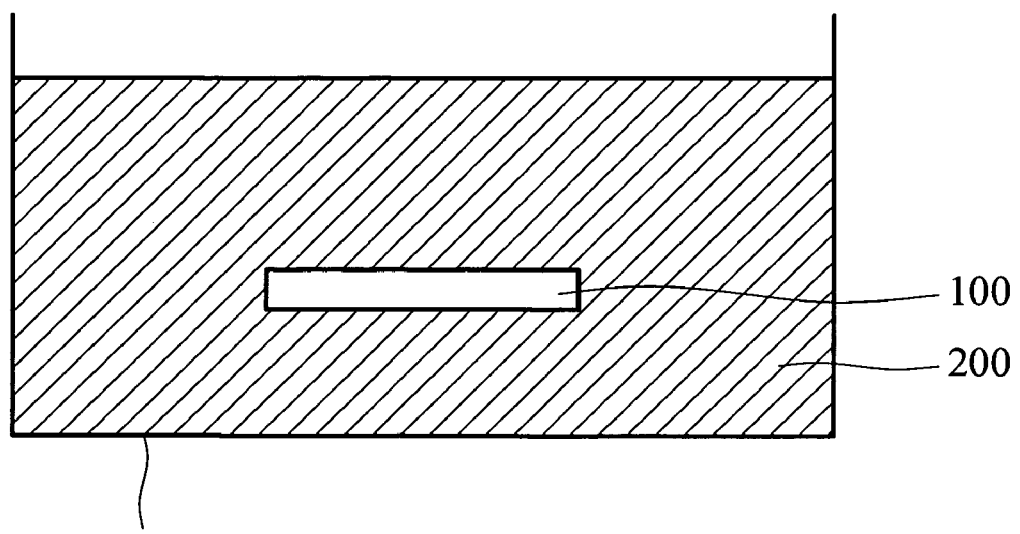

In FIG. 4, the silicon-containing substrate 100 having the transistor 10 partially covered by the metal silicide layer 170 is immersed into a chemical tank 300 containing an electrolyte 200. A selective deposition such as electroless plating, ion displacement process or the like can thus be performed in the chemical tank 300 and a conductor layer 180 such as a metal layer or a metal-containing layer can thus be selectively formed over each metal silicide layer 170 through chemical reaction such as ion reduction or ion replacement, without additional power supplied by an anode and a cathode, as is required in conventional electroplating.

Figure 5:
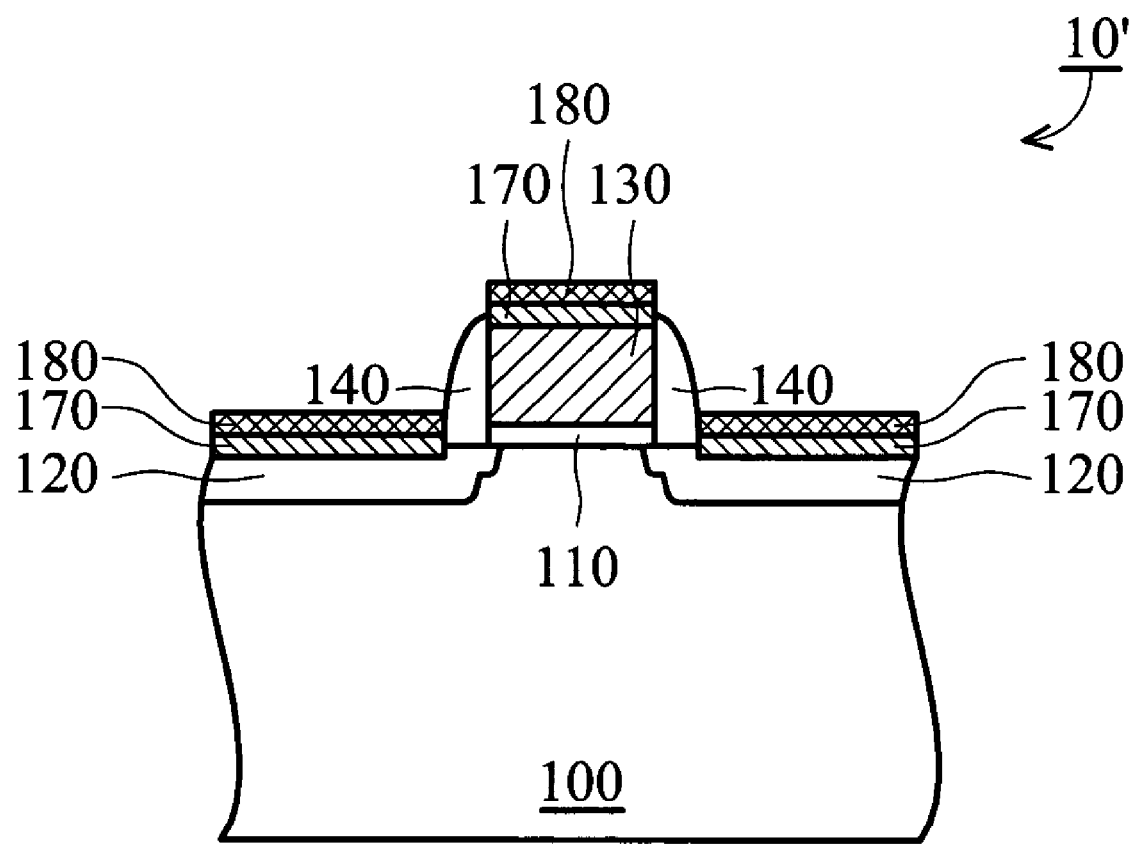

In FIG. 5, after the selective deposition, a conductor layer 180 with a second resistivity is formed over each source/drain region 120 and the gate electrode 130 respectively, thus forming a self-aligned metallized bilayer thereon. As shown in FIG. 5, a resistance-reduced transistor 10' of the invention comprises a silicon-containing substrate 100 having a gate stack (referring to the gate electrode 130 and the gate insulator 110) formed thereon, wherein the gate stack exposes a silicon gate electrode thereof. A pair of source/drain regions 120 are oppositely disposed in the silicon substrate 100 adjacent to the gate stack and a metallized bilayer (referring to the conductor layer 180 and the metal silicide layer 170) overlies each source/drain region and the silicon gate electrode thereby to respectively reduce resistance thereof, wherein the metallized bilayer comprises a metal top layer.

As shown in FIG. 4, when an electroless plating process is adopted to selectively form the conductor layer 180, the electrolyte 200 adopted in the selective deposition includes at least metal ions, catalysts such as palladium (Pd), Ni, Pt or Co, reducing agents such as sodium hypophosphite, formaldehyde, DEAB (n-diethylamine borane), sodium borohydride or hydrazine and complex agents such as EDTA, salts of tartaric acid or TEA (triethanolamine). Further, other agents such as stabilizer, buffer solution of predetermined metal ion, wetting agent or brightener can be further included in the electrolyte 200 to enhance the efficiency of the electroless plating. The metal ions in the electrolyte 200 can be ions of Au or refractory metal such as cobalt (Co), tantalum (Ta), titanium (Ti), platinum (Pt), tungsten (W), nickel (Ni), palladium (Pd), etc. Preferably, the metal salicide 170 is nickel silicide or cobalt silicide and the conductor layer 180 is a metal layer comprising the same metal ion as that of the metal silicide 170 thereunder.

Preferably, the metal ions in the electrolyte 200 are the same as those of the metal silicide layer 170, thus forming the conductor layer 180 from the same type of metal ion used in the metal silicide layer 170 thereunder for easy fabrication. The metal ions in the electrolyte 200 also function as a catalyst for the electrolyte 200 and thus enhance the selective deposition.

Moreover, the thickness of the conductor layer 180 is about 50 Å to 500 Å and has a thickness ratio of about 1:1-1:10 to the metal silicide layer 170. In the present invention, the metal silicide layer 170 also functions as a seed layer when the thickness thereof is less then 50 Å. Due to the formation of the conductor layer 180 on the metal silicide layer 170, the metal material of the conductor layer 180 shows a second resistivity smaller than the first resistivity of the metal silicide layer 170, the sheet resistance over the gate electrode 130 and each source/drain region 120 can be lowered to a level of milliohms, thereby reducing contact resistance or sheet resistance of the device or active region thereof, thus enhancing performance thereof. Moreover, the metal material of the conductor layer 180 also shows a better etching resistance to the subsequent etching process for forming contact holes, for example, than the metal silicide layer 170 thereunder.

Figure 6:
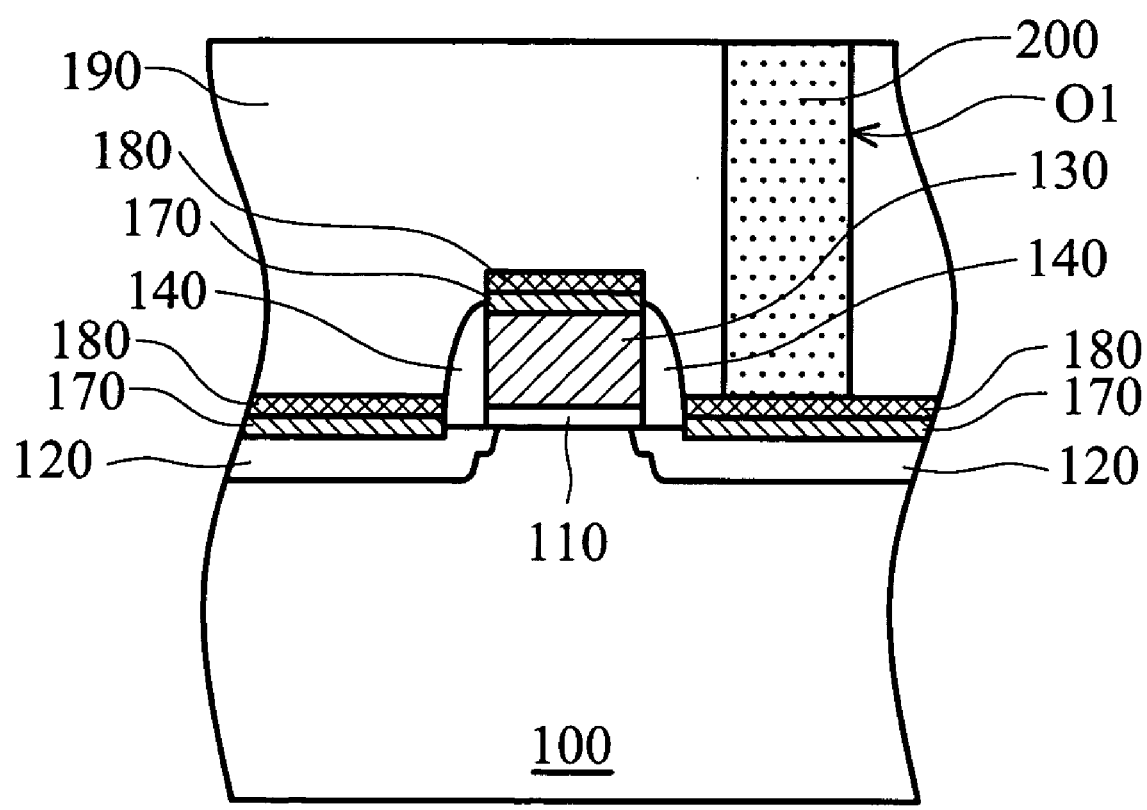

Next, as shown in FIG. 6, a dielectric layer 190, for example a phosphosilicate glass (PSG) layer or borophosphosilicate glass (BPSG) layer, is formed over the substrate 100 and the resistance-reduced transistor 10' with an opening $O_1$ formed therein. The opening $O_1$ can be formed at a position related to one of the active regions, such as the source/drain region 120 or the gate electrode 130 of the resistance-reduced transistor 10', and exposes the top surface thereof. Next, a conductive layer 200 is formed in the opening $O_1$ by sequential deposition and planarization of a conductive material such as tungsten to thereby form a conductive contact as an interconnect between the underlying transistor and a substantially formed conductive line (not shown).

Figure 7:
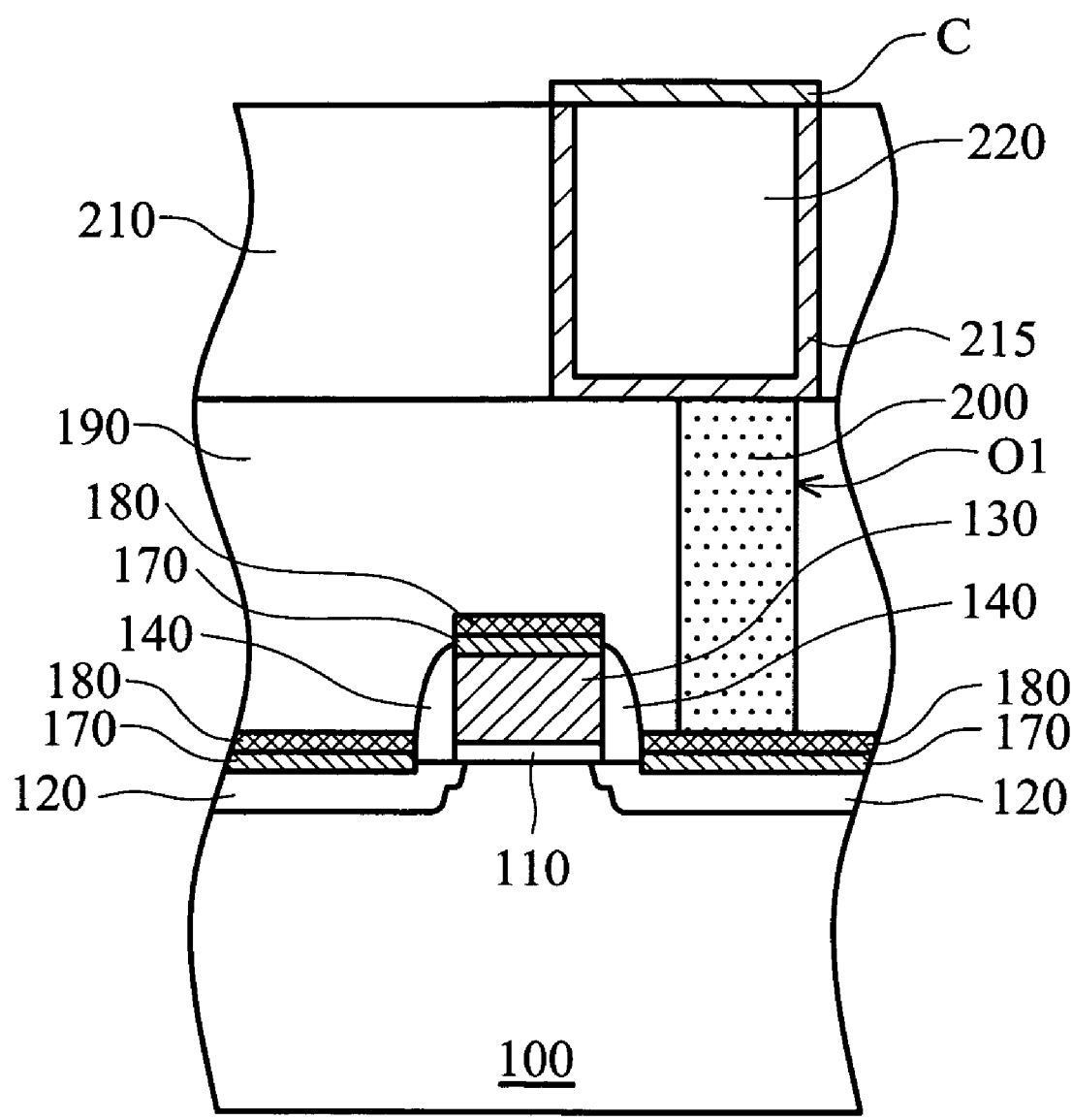

In FIG. 7, a dielectric layer 210 with an electrically conductive feature 220, such as a copper line, is formed over the first dielectric layer 190 by conventional line fabrication, wherein the conductive line 220 electrically connects the underlying conductive layer 200. Optionally, a diffusion barrier layer 215 can be formed between the dielectric layer 210 and the conductive feature 220 to prevent undesired ion diffusion of the conductive material of the conductive feature 220. The dielectric layer 210 can comprise a dielectric material such as phosphosilicate glass (PSG), borophosphosilicate glass (BPSG) or a low-k dielectric material with dielectric constant less than 3.9.

Next, a conductive cap C at a thickness of about 100~1000 Å is formed on a top surface of the conductive feature 220 and the diffusion barrier layer 215 to thereby encapsulate the conductive feature 220 and enhance reliability thereof. Formation of the conductive cap C can be achieved by the described selective depositions illustrated in FIG. 4. The conductive cap C can be formed as a single layer or a composite layer including different layers of conductive material and may comprise metal such as Au, Pt, Ni, Co, Pd, W or Ti, or metal-containing material such as silicide of Au, Pt, Ni, Co, Pd, W or Ti. Preferably, the conductive cap C comprises similar material of the underlying conductive feature 220 and/or the diffusion barrier layer 215.

Figure 8:
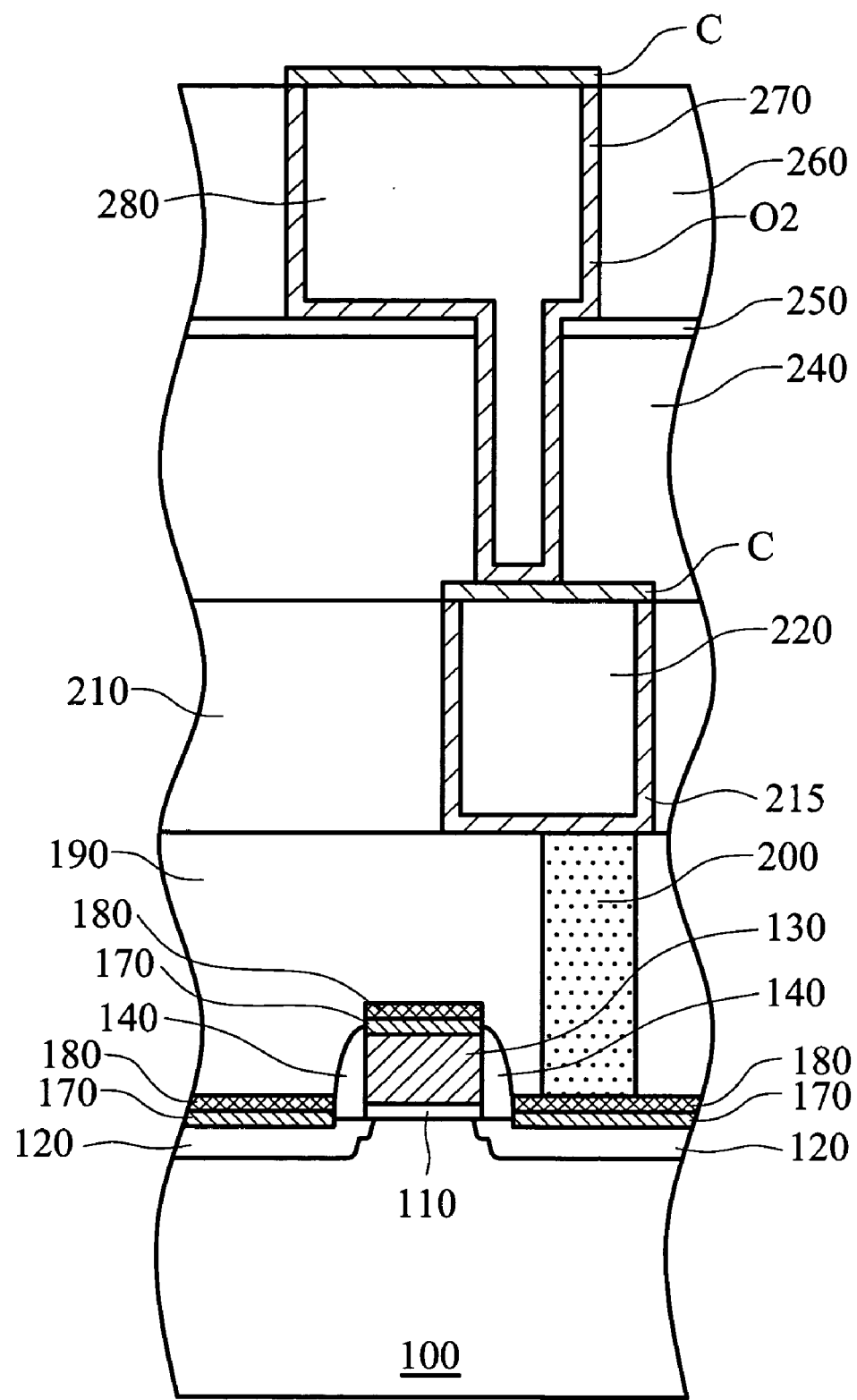

Next, in FIG. 8, a dielectric layer 240, an etch stop layer 250 and a dielectric layer 260 are sequentially formed over the dielectric layer 210, having an opening $O_2$ formed therethrough. The opening $O_2$ is illustrated as a dual damascene opening but is not restricted thereto and can be formed by, for example, a conventional dual damascene process. A conductive layer 280 such a copper layer is then formed in the opening $O_2$ to thereby form a conductive interconnect feature. Typically, but not necessarily, a conformal diffusion barrier layer 270 is formed in the opening $O_2$ prior to formation of the conductive layer 280 for preventing undesired ion diffusion from the conductive layer 280. The dielectric layers 240 and 260 can comprise, for example, a low-k dielectric material with dielectric constant less than 3.9.

As shown in FIG. 8, another conductive cap C at a thickness of about 100~1000 Å is respectively formed on a top surface of the conductive layer 220 and the diffusion barrier layer 280 to thereby encapsulate the conductive feature layer 280 and enhance reliability of the conductive interconnect feature. Formation of the conductive cap C can be achieved by the described methods of selective deposition illustrated in FIG. 4. The conductive cap C can be formed as a single layer or a composite layer including different layers of conductive material and may comprise metal such as Au, Pt, Ni, Co, Pd, W or Ti, or metal-containing material such as silicide of Au, Pt, Ni, Co, Pd, W or Ti. Preferably, the conductive cap C may comprise materials similar to the conductive layer 280 and the diffusion barrier layer 270.

Figure 9:
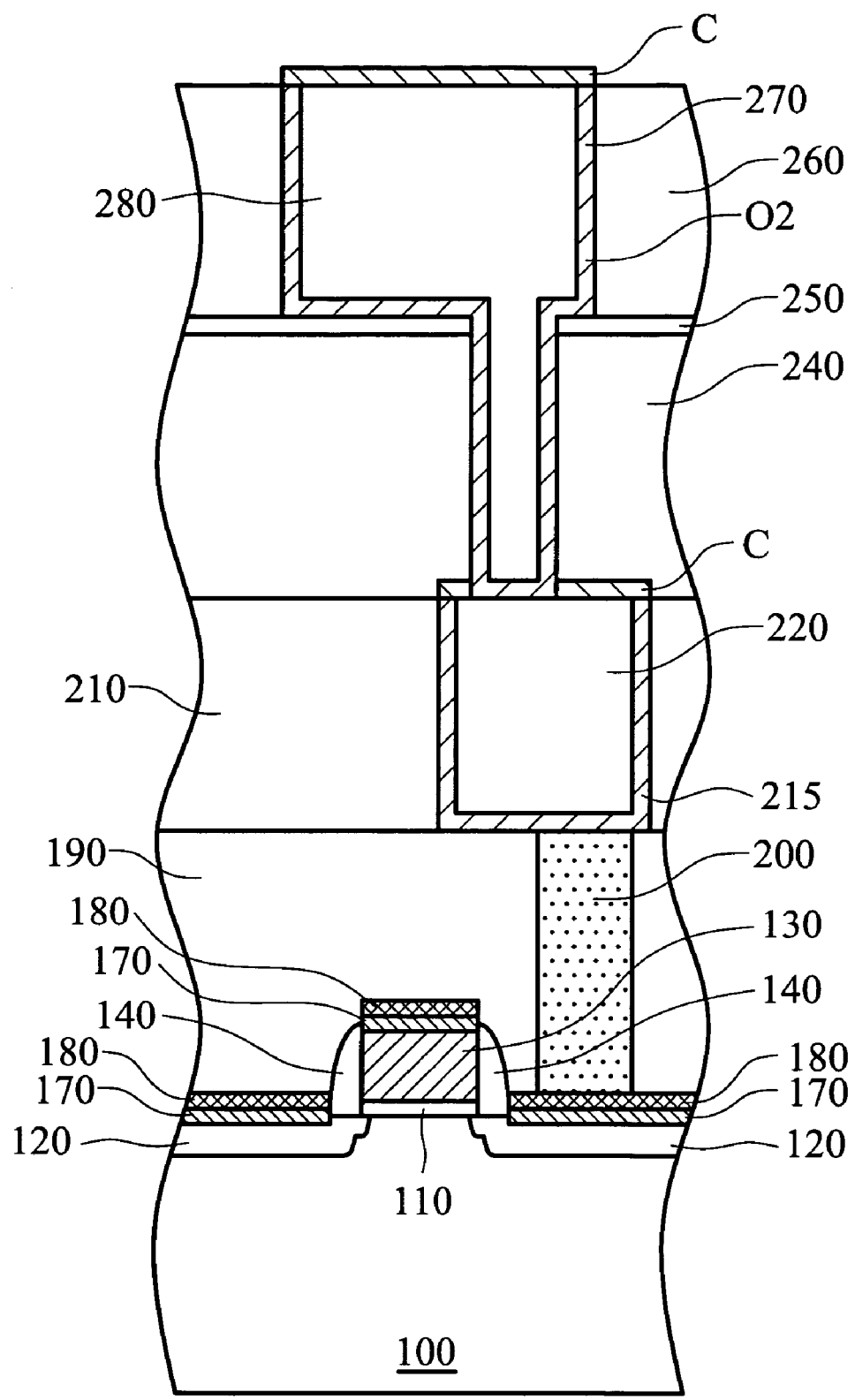
FIGS. 9-11 are schematic diagrams showing variations of the semiconductor device according to other embodiments of the invention.

In some embodiments, a portion of the conductive cap C over the conductive layer 220, exposed by the opening $O_2$, is removed by an additional etching such as wet etching and a sequentially formed conductive interconnect feature (referring to the conductive layer 280 and the diffusion barrier layer 270 here) can directly connect the underlying conductive layer 220 to thereby reduce a contact resistance therebetween, as shown in FIG. 9.

Figure 10:
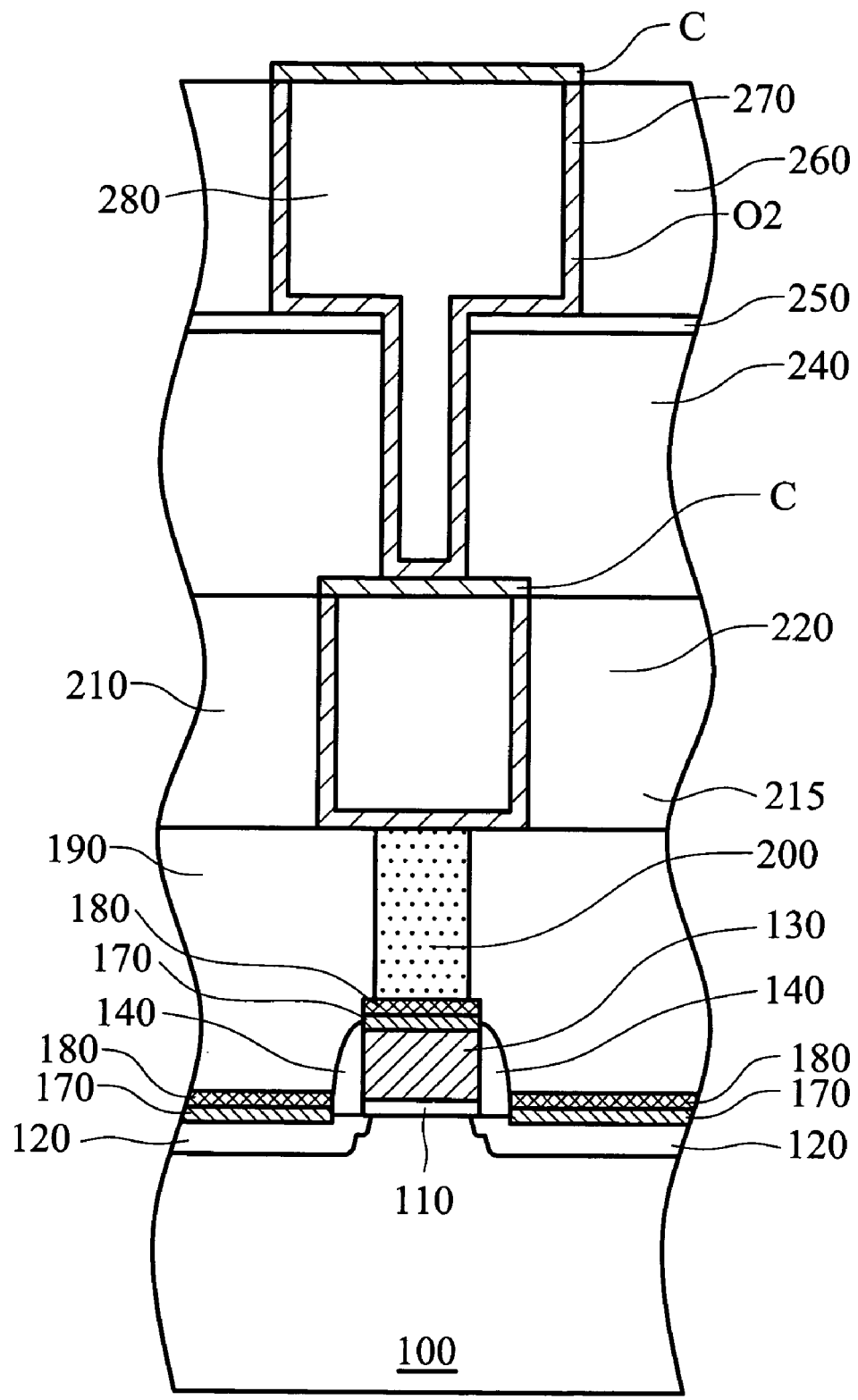
Figure 11:
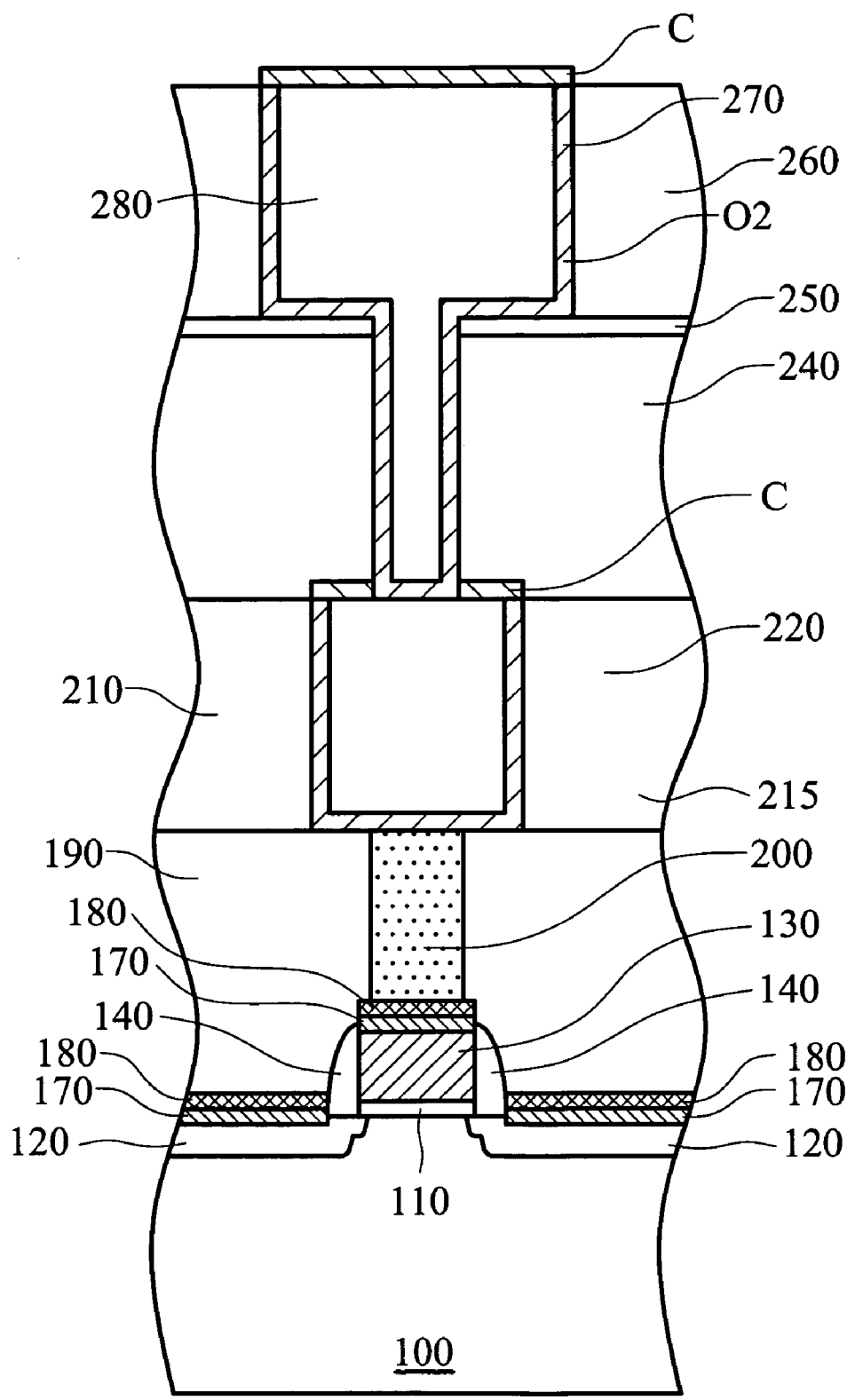

FIGS. 10 and 11 show variations of the arrangement of the electrically conductive contact and the conductive cap in the described semiconductor devices. In FIG. 10, a conductive contact is formed above the gate electrode of the resistance-reduced transistor 10 and the conductive cap C encapsulates top surfaces of the conductive layer 220 and 280. In FIG. 11, the conductive contact is formed above the gate electrode of the resistance-reduced transistor 10 and conductive caps C are respectively formed on the top surface of the conductive layer 220 and 280. Moreover, in FIG. 11, a portion of the conductive cap C over the conductive layer 220, exposed by the opening $O_2$, is removed by an additional etching, such as wet etching, and a sequentially formed conductive interconnect feature (referring to the conductive layer 280 and the diffusion barrier layer 270 here) can directly connect the underlying conductive layer 220 to thereby reduce a contact resistance therebetween.

In some embodiments, a self-aligned metallized (SAM) bilayer is formed over a portion of a semiconductor device such as a transistor to reduce sheet resistance or contact resistance thereon and the process for forming the same are illustrated. The metallized bilayer comprises a metal top layer and metal silicide bottom layer.

Moreover, in some embodiments, the self-aligned metallization process of the invention is also applicable to form a metallized bilayer over an exposed silicon portion of a semiconductor device such as a capacitor or a resistor to reduce the contact resistance therein. The exposed silicon portion described in the invention refers to a silicon-containing portion comprising doped or undoped monocrystal silicon, polysilicon, amorphous silicon or the like, and is not only limited to the monocrystal silicon. Moreover, the self-aligned metallization process is also capable of forming a conductive cap over conductive features of an interconnect structure to ensure reliability of, for example, contact resistance (Rc) or electromigration (EM) thereof.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A resistance-reduced semiconductor device, comprising:
   a resistance-reduced transistor, comprising:
   a gate stack on a silicon-containing substrate;
   a pair of source/drain regions in the silicon-containing substrate, oppositely adjacent to the gate stack;

a metallized bilayer overlying each source/drain region to thereby reduce a resistance thereof, wherein the metallized bilayer comprises a metal top layer;

a first dielectric layer having a conductive contact, overlying the resistance-reduced transistor;

a second dielectric layer having a first conductive feature, overlying the first dielectric layer, wherein the first conductive feature and the conductive contact electrically form a conductive pathway down to the top metal layer over one of the source/drain regions;

a third dielectric layer having a second conductive feature, overlying the second dielectric layer; and a first conductive cap layer partially overlying the first conductive feature, wherein the first conductive cap layer exposes a portion of the top surface of the first conductive feature to thereby contact the second conductive feature directly and the first conductive feature.

2. The semiconductor device as claimed in claim 1, further comprising a metal silicide layer disposed between the metal top layer and each source/drain region.

3. The semiconductor device as claimed in claim 2, wherein the metal top layer comprises the same type of metal ion as that of the metal silicide layer.

4. The semiconductor device as claimed in claim 1, wherein the metal top layer comprises refractory metal.

5. The semiconductor device as claimed in claim 2, wherein the metal silicide layer comprises a silicide of a refractory metal.

6. The semiconductor device as claimed in claim 1, further comprising a second conductive cap layer overlying a top surface of the first conductive features.

7. The semiconductor device as claimed in claim 6, wherein the second conductive cap layer comprises a metal or a metal-containing material.

8. The semiconductor device as claimed in claim 1, wherein the first conductive cap layer comprises a metal or a metal-containing material.

* * * * *